United States Patent
Ali et al.

(10) Patent No.: US 9,276,532 B2
(45) Date of Patent: Mar. 1, 2016

(54) HIGH SPEED AMPLIFIER

(71) Applicants: Ahmed Mohamed Abdelatty Ali, Oak Ridge, NC (US); Huseyin Dinc, Greensboro, NC (US)

(72) Inventors: Ahmed Mohamed Abdelatty Ali, Oak Ridge, NC (US); Huseyin Dinc, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 64 days.

(21) Appl. No.: 14/012,185

(22) Filed: Aug. 28, 2013

(65) Prior Publication Data

US 2015/0061768 A1     Mar. 5, 2015

(51) Int. Cl.
| | | |
|---|---|---|
| *H03F 3/16* | (2006.01) | |
| *H03F 1/48* | (2006.01) | |
| *H03F 3/193* | (2006.01) | |
| *H03F 3/195* | (2006.01) | |

(52) U.S. Cl.
CPC .................. *H03F 3/16* (2013.01); *H03F 1/483* (2013.01); *H03F 3/193* (2013.01); *H03F 3/195* (2013.01); *H03F 2200/492* (2013.01)

(58) Field of Classification Search
USPC ................................... 330/292, 76, 277, 283
See application file for complete search history.

(56) References Cited

U.S. PATENT DOCUMENTS

| | | | |
|---|---|---|---|
| 6,064,262 A | 5/2000 | Wang | |
| 6,586,958 B2 | 7/2003 | Sudo et al. | |
| 7,679,446 B2 | 3/2010 | Kim et al. | |
| 7,714,652 B2 | 5/2010 | Mangudi et al. | |
| 8,577,325 B2 * | 11/2013 | Lee et al. | ...................... 455/341 |
| 2002/0149425 A1 | 10/2002 | Chawla et al. | |
| 2003/0076172 A1 | 4/2003 | Tichauer | |
| 2003/0141929 A1 | 7/2003 | Casper et al. | |
| 2006/0071735 A1 | 4/2006 | Kang | |
| 2008/0007357 A1 | 1/2008 | Tserng et al. | |
| 2008/0315950 A1 | 12/2008 | Koh et al. | |
| 2010/0103572 A1 | 4/2010 | Worley | |
| 2010/0182093 A1 | 7/2010 | Hasegawa | |
| 2012/0139643 A1 | 6/2012 | Scott et al. | |
| 2013/0127539 A1 | 5/2013 | Murakami | |

FOREIGN PATENT DOCUMENTS

| | | |
|---|---|---|
| EP | 0975089 A2 | 1/2000 |
| JP | H02301321 A | 12/1990 |

OTHER PUBLICATIONS

Extended European Search Report and Search Opinion issued in European application No. 14181179.4, communication dated Mar. 2, 2015 (10 pages).

F. Schlogl et al., "1.5 GHz OPAMP in 120nm Digital CMOS", Proceedings of the 30th European Solid-State Circuits Conference (ESSCIRC 2004), pp. 239-242, Sep. 2004.

(Continued)

*Primary Examiner* — Hieu Nguyen (74) *Attorney, Agent, or Firm* — Kenyon & Kenyon LLP (57) ABSTRACT

A circuit may include one or more transistors connected directly to an output, and an inductance network. The inductance network may connect to a source node of at least one of the transistors, to compensate capacitance of the output. Thus, the response time of the circuit may decrease, and a non-dominant frequency response pole frequency of the circuit may increase.

23 Claims, 6 Drawing Sheets

(56) References Cited

OTHER PUBLICATIONS

S. Heng et al., "A Low-Power High-PSRR Low-Dropout Regulator With Bulk-Gate Controlled Circuit", IEEE Transactions on Circuits and Systems II: Express Briefs, vol. 57, No. 4, pp. 245-249, Apr. 2010.

Extended European Search Report and Search Opinion issued in European application No. 14181177.8, communication dated Feb. 20, 2015 (9 pages).

* cited by examiner

HIGH SPEED AMPLIFIER

BACKGROUND

In an amplifier, there may be a non-dominant frequency pole whose frequency value is proportional to gm/C, where gm is the transconductance of the output stage and C is the total capacitance at the output node (for example, C may include the capacitance of the load at the output node, the capacitance of the output node itself, and parasitic capacitances).

For high speed applications, the non-dominant pole may need to be pushed out to high frequencies. A low non-dominant pole frequency can lead to bad phase margin (underdamped behavior) and low bandwidth. To increase the frequency of the non-dominant pole, the amplifier may be designed with increased current in the output stage of the amplifier to increase the gm of the output stage. This, however, may lead to increasing power consumption. Additionally, as gm/C may be inherently limited by manufacturing process, increasing current may not be sufficient to increase the frequency of the non-dominant pole of the output stage.

Accordingly, there is a need for an amplifier with increased or improved non-dominant pole frequencies with improved bandwidth and settling time, without increasing the current of the output stage.

DETAILED DESCRIPTION

Figure 1:
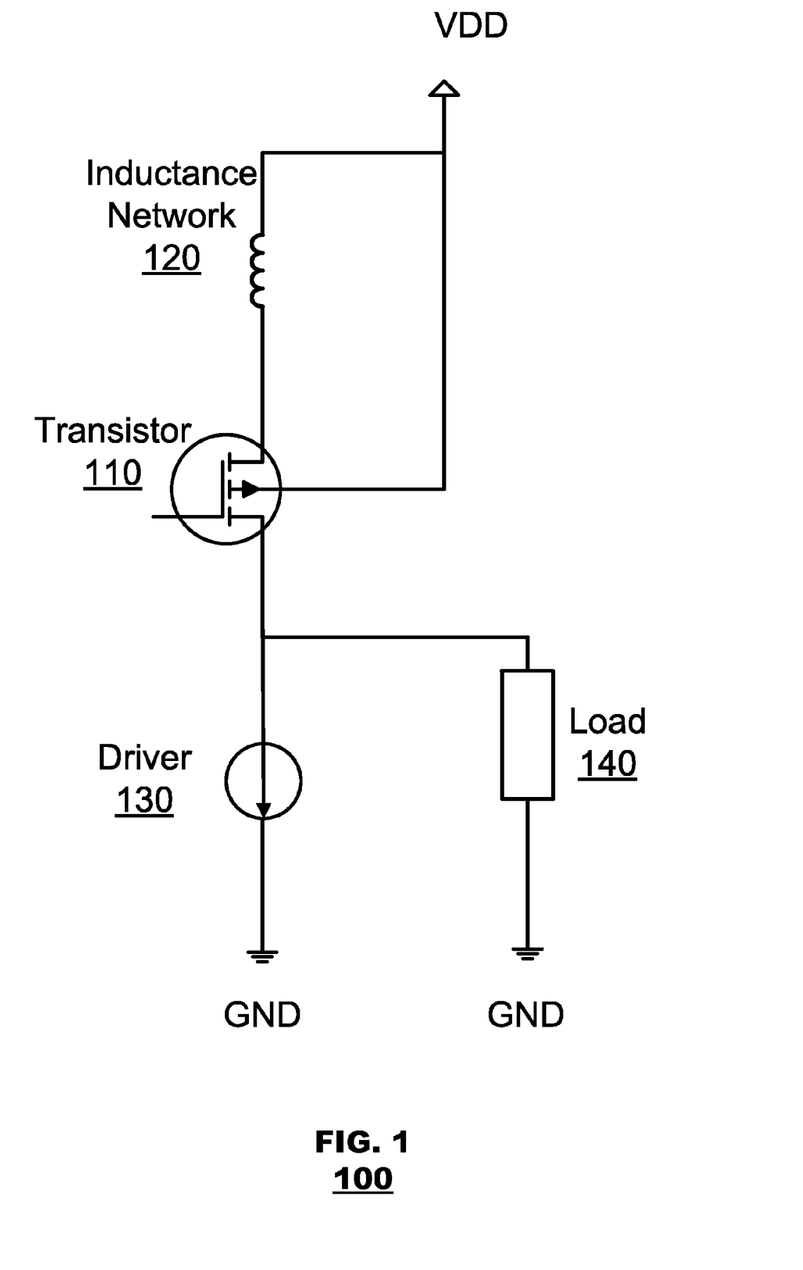
FIG. 1 illustrates a circuit according to an embodiment of the present disclosure.

According to an embodiment illustrated in FIG. 1, a circuit 100 may include a transistor 110, and an inductance network 120. The transistor 110 may be output on an output node to drive a load 140. The inductance network 120 may be connected to a source node of the transistor 110, to compensate for the capacitance of the output node.

In FIG. 1, circuit 100 may be an amplifier circuit. Transistor 110 may be a PMOS (P-type Metal Oxide Silicon) transistor. Transistor 110 may have a gate connected to an input AC signal to be amplified. Driver 130 may be a current driver connected in series with the transistor 110 between supplies VDD and GND, to generate the output node to drive the load 140.

Alternatively, transistor 110 may be a current driving transistor configured to bias a current through the amplifier circuit 100. In such a case, the driver 130 may receive the input signal to be amplified.

In the above configurations, transistor 110 may be connected to VDD on its source node, to the output node on its drain node, and in series with the inductance network 120 to the supply VDD. The transistor 110 may have its source node connected to the inductance network 120, such that the inductance network 120 compensate for the capacitance associated with the output node and the transistor 110.

Circuit 100 employs the inductance network 120 in series with the transistor 110, for example, by connecting the inductance network 120 in series with the transistor 110 on the source node of the transistor 110. The inductance of the inductance network 120 may effectively "tune out" the capacitance at the output node (for example, including the load capacitance, parasitic capacitances of the circuit 100 output node), and push out the effective non-dominant pole effective frequency of the circuit 100 or create complex poles that have better settling performance. The optimum value of the inductance network 120 may depend on the gm2 of the circuit 100 in the circuit branch (may include the transistor 110 and other devices), and the total capacitance (C2) at the output node of the circuit 100. The inductance value of the inductance network 120 may be determined according to the formula: $L = k\, C2/gm2^2$, where k is a constant. The inductance (L), capacitance (C2) and effective resistance (1/gm2) in the circuit 100 may form a parallel (RLC) resonant circuit, since each of the inductance (L), capacitance (C2) and effective resistance (1/gm2) are effectively connected together in parallel in transistor 110. The response of the circuit 100 thus may be made faster by utilizing the inductance network 120, and the non-dominant frequency response pole frequency of the circuit 100 may be increased.

According to simulations, to achieve similar response without the inductance network 120, the power through the circuit 100 may need to be increased by about 60%. In other words, the inductance network 120 may reduce power consumption in the circuit 100 by about 40% to achieve the same response time.

Figure 2:
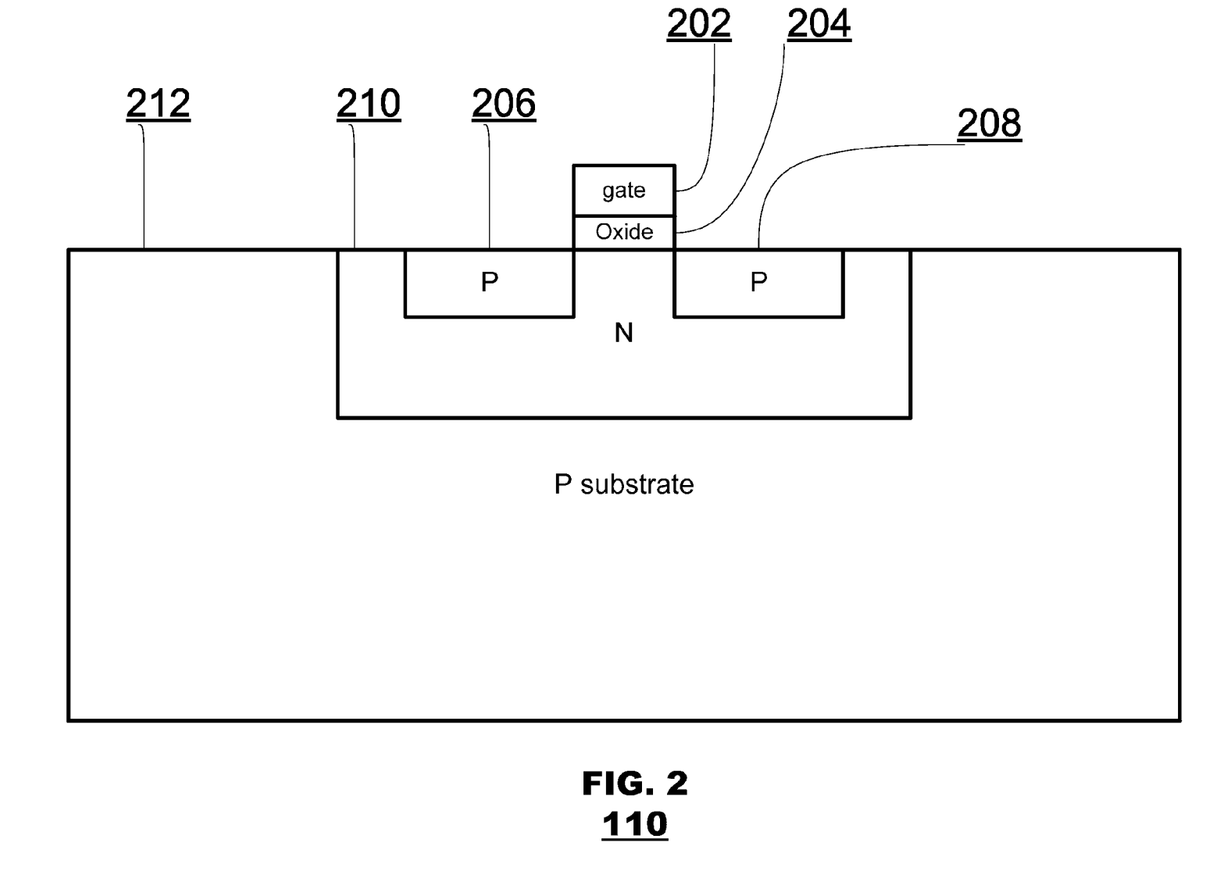
FIG. 2 illustrates a cross-sectional diagram of a transistor in a circuit according to an embodiment of the present disclosure.

FIG. 2 illustrates an idealized cross-sectional diagram of the transistor 110.

The transistor 110 may be a PMOS with a gate 202 with a gate oxide layer 204, a P-doped source region 206, a P-doped drain region 208, a N-doped well region 210, a P type substrate 212.

According to an embodiment implemented in circuit 100, the transistor 110 may have its P-doped source region 208 connected to inductance network 120. Various taps, such as diffusion or metal taps, may be implemented in the above portion of transistor 110 to connect to the inductance network 120. The inductance network 120 may be implemented using a metal strip formed on a substrate, with the geometry and metal properties of the metal strip and the substrate to define a specific desired inductance value. The inductance network 120 may include a handle-shaped inductor or a spiral-shaped inductor. The inductance value of the inductance network 120 may be between 100 pico-Henry and 350 pico-Henry. Additional elements may be included in the inductance network 120.

Figure 3:
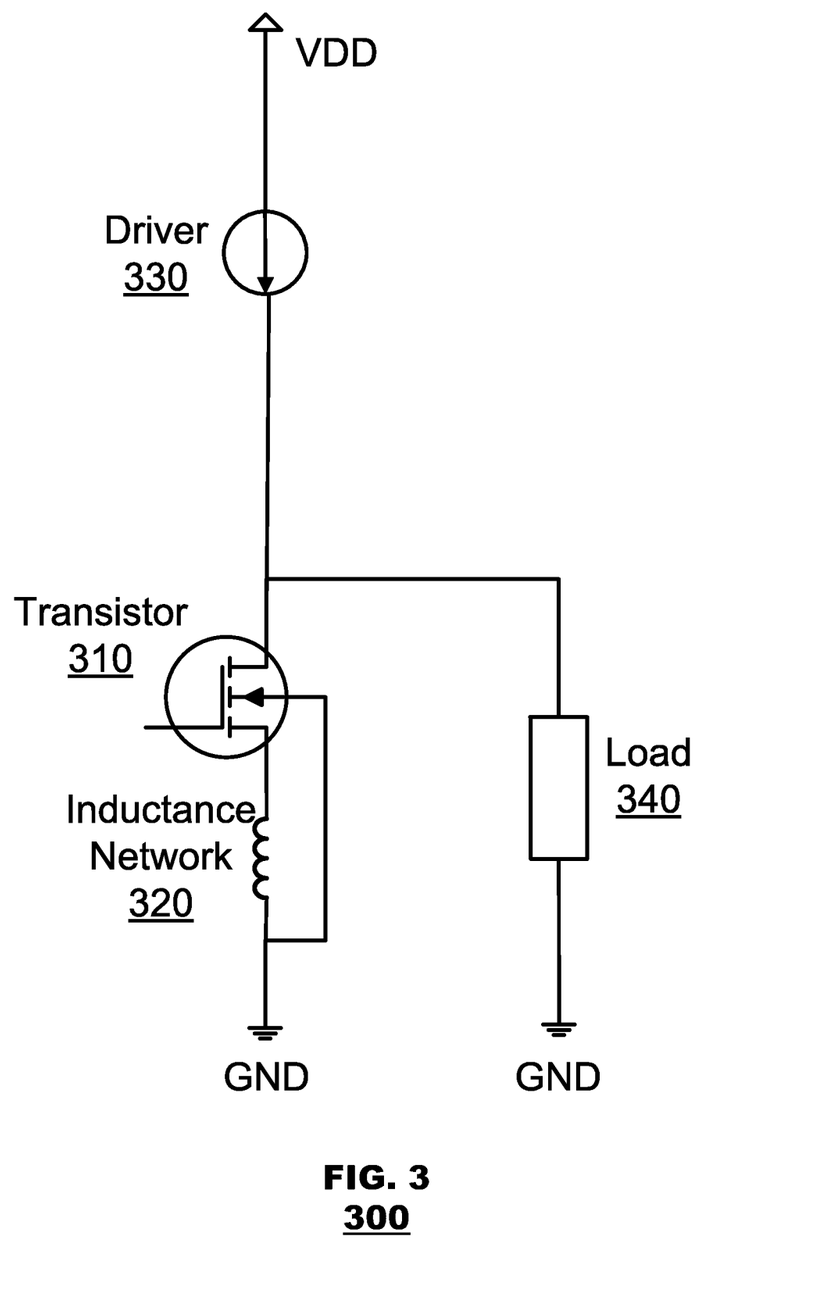
FIG. 3 illustrates a circuit according to an embodiment of the present disclosure.

According to an embodiment illustrated in FIG. 3, a circuit 300 may include a transistor 310, and an inductance network 320. The transistor 310 may be output on an output node to drive a load 340. The inductance network 320 may be connected to a source node of the transistor 310, to compensate for the capacitance of the output node.

In FIG. 3, circuit 300 may be an amplifier circuit. Transistor 310 may be a NMOS (N-type Metal Oxide Silicon) transistor. Transistor 310 may have a gate connected to an input AC signal to be amplified. Driver 330 may be a current driver connected in series with the transistor 310 between supplies VDD and GND, to generate the output node to drive the load 340.

Alternatively, transistor 310 may be a current driving transistor configured to bias a current through the amplifier circuit 300. In such a case, the driver 330 may receive the input signal to be amplified.

In the above configurations, transistor 310 may be connected to GND on its source node, to the output node on its drain node, and in series with the inductance network 320 to the supply GND. The transistor 110 may have its source node connected to the inductance network 120, such that the inductance network 120 compensate for the capacitance associated with the output node and the transistor 110.

Figure 4:
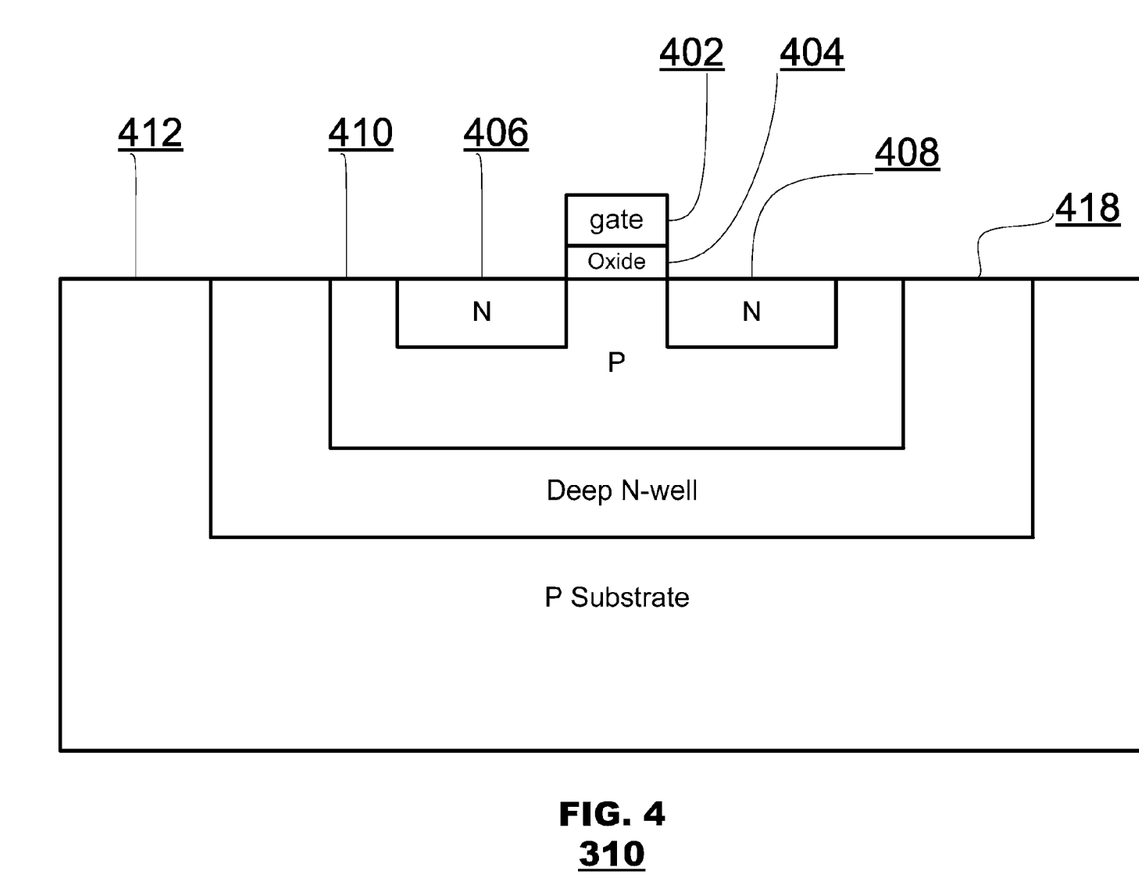
FIG. 4 illustrates a cross-sectional diagram of a transistor in a circuit according to an embodiment of the present disclosure.

FIG. 4 illustrates an idealized cross-sectional diagram of the transistor 310.

The transistor 310 may be a NMOS with a gate 402 with a gate oxide layer 404, a N-doped source region 406, a N-doped drain region 408, a P-doped well region 410, a deep N-doped well region 418, a P type substrate 412.

According to an embodiment implemented in circuit 300, the transistor 310 may have its N-doped source region 408 connected to inductance network 320. Various taps, such as diffusion or metal taps, may be implemented in the above portion of transistor 310 to connect to the inductance network 320. The inductance network 320 may be implemented using a metal strip formed on a substrate, with the geometry and metal properties of the metal strip and the substrate to define a specific desired inductance value. The inductance network 320 may include a handle-shaped inductor or a spiral-shaped inductor. The inductance value of the inductance network 320 may be between 100 pico-Henry and 350 pico-Henry. Additional elements may be included in the inductance network 320.

Figure 5:
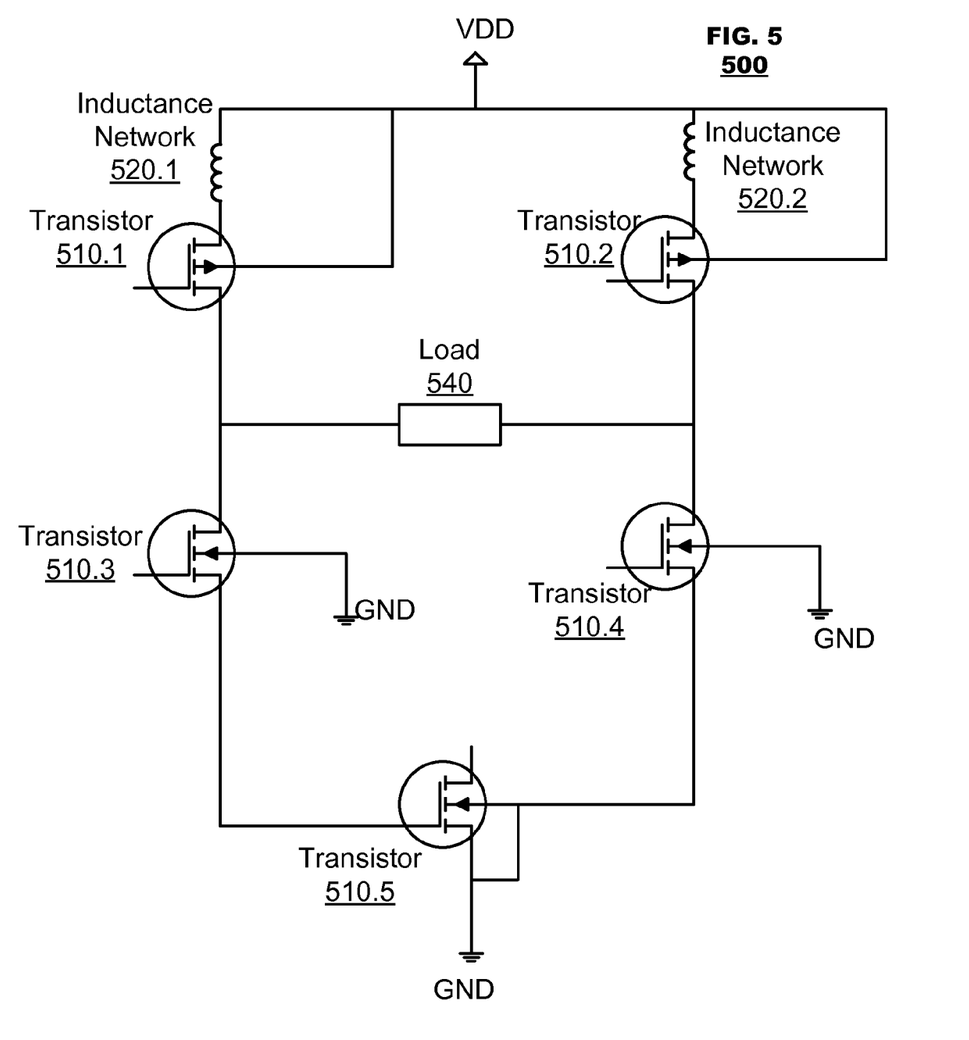
FIG. 5 illustrates a circuit according to an embodiment of the present disclosure.

FIG. 5 illustrates a circuit 500 according an embodiment.

Circuit 500 may include a plurality of transistors 510.1-510.5 and a plurality of inductance networks 520.1-520.2, configured in similar manners as in circuits 100 and circuits 300 of FIGS. 1 and 3. Circuit 500 may be configured as a differential pair amplifier driving differential outputs connected to a load 540. Circuit 500 may be configured as a differential pair amplifier where each differential branch may be configured as a cascode amplifier.

Transistors 510.1-510.4 may be connected to the differential output nodes on their respective drain nodes, and transistor 510.5 may be a biasing transistor. According to an embodiment, only the transistors 510.1-510.2 which are connected directly on their drain or source nodes to the output nodes, need to be connected to a respective inductance network 520.1-520.2. The inductance networks 520.1-520.2 may be implemented on the same circuit unit or chip as the transistors 510.1-510.4 or on separate circuit units or chips. Alternatively, circuit 500 may have an inductor connected between transistor 510.5 and GND.

Transistors 510.1 and 510.2 may be PMOS transistors as similar to transistor 110 in FIGS. 1 and 2, and transistors 510.3 and 510.4 may be NMOS transistors as similar to transistor 310 in FIGS. 3 and 4.

Figure 6:
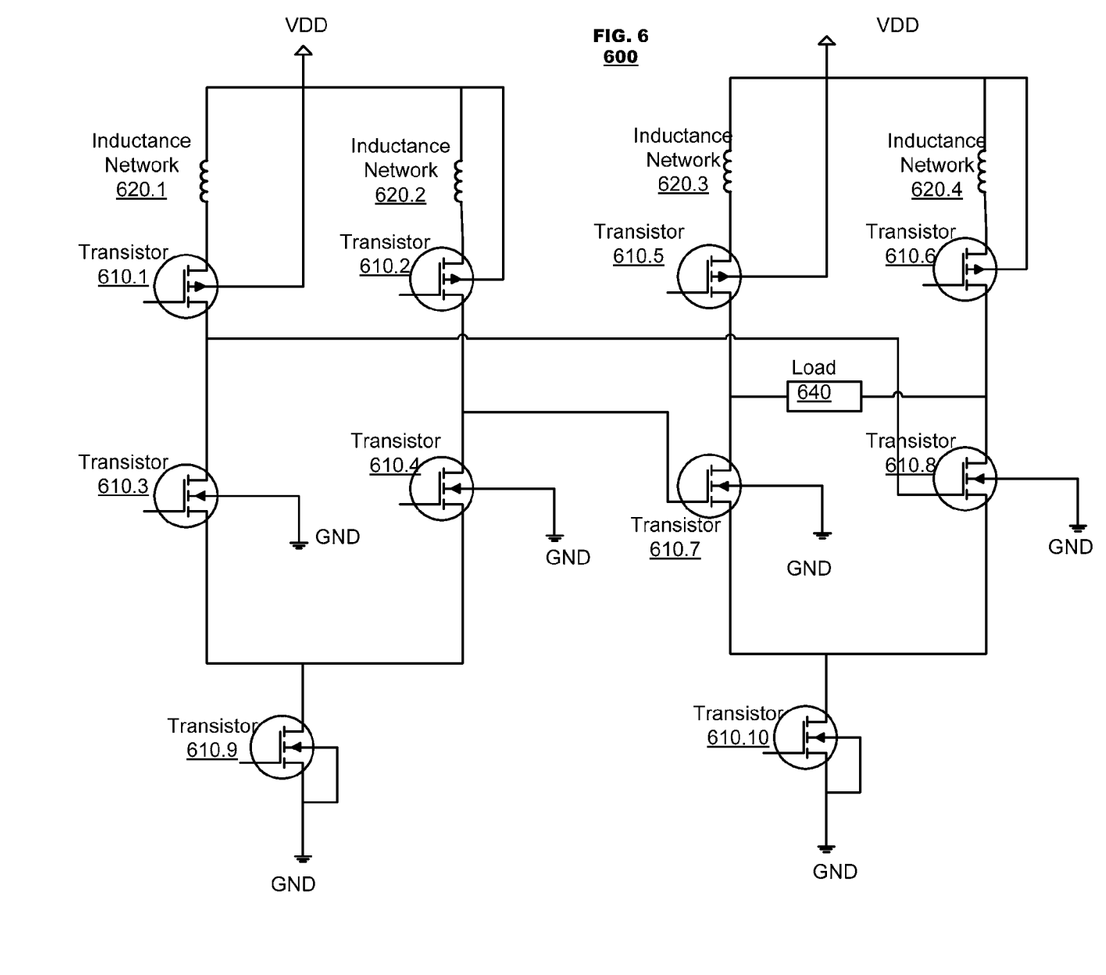
FIG. 6 illustrates a circuit according to an embodiment of the present disclosure.

FIG. 6 illustrates a circuit 600 according an embodiment.

Circuit 600 may include a plurality of transistors 610.1-610.10 and a plurality of inductance networks 620.1-620.8, configured in similar manners as in circuits 100 and circuits 300 of FIGS. 1 and 3. Circuit 600 may be configured as a two-staged differential pair amplifier driving differential outputs connected to a load 640. Circuit 600 may be configured as a two-staged differential pair amplifier where each differential branch may be configured as a cascode amplifier.

Transistors 610.1-610.8 may be connected to the differential output nodes on their respective drain nodes, and transistors 610.9 and 610.10 may be biasing transistors. According to an embodiment, only the transistors 610.1-2 and 610.5-610.6 which are connected directly on their drain or source nodes to the output nodes, need to be connected to a respective inductance network 620.1-620.4. The inductance networks 620.1-620.4 may be implemented on the same circuit unit or chip as the transistors 610.1-610.8 or on separate circuit units or chips. Alternatively, circuit 600 may have inductors connected between transistor 610.9 and GND and between transistor 610.10 and GND.

Transistors 610.1-610.2 and 610.5-610.6 may be PMOS transistors as similar to transistor 110 in FIGS. 1 and 2, and transistors 610.3-610.4 and 610.7-610.8 may be NMOS transistors as similar to transistor 310 in FIGS. 3 and 4.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A circuit, comprising:
   one or more transistors connected directly to an output node; and
   an inductance network connected to a source node of at least one of the transistors, wherein
      an inductance L of the inductance network is based on a transconductance gm of the circuit and a capacitance C at the output node, and
      the inductance network compensates the capacitance C at the output node,
   wherein the inductance L is determined according to $L=kC/gm^2$, k being a constant.

2. The circuit of claim 1, wherein at least two transistors of the one or more transistors are connected in series with each other to form an amplifier.

3. The circuit of claim 1, wherein the inductance network comprises an inductor.

4. The circuit of claim 1, wherein the inductance network comprises an inductor that is connected to the at least one of the transistors at a first terminal and connected to a DC voltage at a second terminal.

5. The circuit of claim 1, wherein the inductance network comprises an inductor comprising a metal layer and a substrate.

6. The circuit of claim 1, wherein the inductance L is between 100 pico-Henry and 350 pico-Henry.

7. The circuit of claim 1, wherein the inductance network comprises an inductor with a handle shape or a spiral shape.

8. A circuit, comprising:
   one or more transistors connected directly to an output node; and
   an inductance network connected to a source node of at least one of the transistors, wherein
      an inductance L of the inductance network is based on a transconductance gm of the circuit and a capacitance C at the output node, and
      the inductance network increases response time of the circuit to an AC input signal,
   wherein the inductance L is determined according to $L=kC/gm^2$, k being a constant.

9. The circuit of claim 8, wherein at least two transistors of the one or more transistors are connected in series with each other to form an amplifier.

10. The circuit of claim 8, wherein the inductance network comprises an inductor.

11. The circuit of claim 8, wherein the inductance network comprises an inductor that is connected to the at least one of the transistors at a first terminal and connected to a DC voltage at a second terminal.

12. The circuit of claim 8, wherein the inductance network comprises an inductor comprising a metal layer and a substrate.

13. The circuit of claim 8, wherein the inductance L is between 100 pico-Henry and 350 pico-Henry.

14. The circuit of claim 8, wherein the inductance network comprises an inductor with a handle shape or a spiral shape.

15. A circuit, comprising:
   one or more transistors connected directly to an output node; and
   an inductance network connected to a source node of at least one of the transistors, wherein
      an inductance L of the inductance network is based on a transconductance gm of the circuit and a capacitance C at the output node, and
      the inductance network increases a frequency of a non-dominant frequency response pole of an AC input signal of the circuit,
   wherein the inductance L is determined according to $L=kC/gm^2$, k being a constant.

16. The circuit of claim 15, wherein at least two transistors of the one or more transistors are connected in series with each other to form an amplifier.

17. The circuit of claim 15, wherein the inductance network comprises an inductor.

18. The circuit of claim 15, wherein the inductance network comprises an inductor that is connected to the at least one of the transistors at a first terminal and connected to a DC voltage at a second terminal.

19. The circuit of claim 15, wherein the inductance network comprises an inductor comprising a metal layer and a substrate.

20. The circuit of claim 15, wherein the inductance L is between 100 pico-Henry and 350 pico-Henry.

21. A method for amplifying an AC input signal, comprising:
   driving one or more transistors with the AC input signal, the one or more transistors being connected directly to an output node; and
   compensating a capacitance C at the output node with an inductance network connected to a source node of at least one of the transistors, wherein
      an inductance L of the inductance network is based on a transconductance gm of the circuit and the capacitance C,
   wherein the inductance L is determined according to $L=kC/gm^2$, k being a constant.

22. The method of claim 21, wherein the inductance network is connected to the at least one of the transistors at a first terminal and connected to a DC voltage at a second terminal.

23. The method of claim 21, further comprising:
driving at least two transistors of the one or more transistors, the at least two transistors being connected in series with each other to form an amplifier.

* * * * *